US010101758B2

(12) United States Patent
Luo et al.

(10) Patent No.: US 10,101,758 B2
(45) Date of Patent: Oct. 16, 2018

(54) LINEAR REGULATOR WITH REAL-TIME FREQUENCY COMPENSATION FUNCTION

(71) Applicant: UNIVERSITY OF ELECTRONIC SCIENCE AND TECHNOLOGY OF CHINA, Chengdu, Sichuan (CN)

(72) Inventors: Ping Luo, Sichuan (CN); Shuangjie Qiu, Sichuan (CN); Kangle Wang, Sichuan (CN); Zelang Liu, Sichuan (CN); Long Huang, Sichuan (CN)

(73) Assignee: UNIVERSITY OF ELECTRONIC SCIENCE AND TECHNOLOGY OF CHINA, Chengdu, Sichuan (CN)

( * ) Notice: Subject to any disclaimer, the term of this patent is extended or adjusted under 35 U.S.C. 154(b) by 0 days.

(21) Appl. No.: 15/834,903

(22) Filed: Dec. 7, 2017

(65) Prior Publication Data

US 2018/0164843 A1    Jun. 14, 2018

(30) Foreign Application Priority Data

Dec. 13, 2016  (CN) .......................... 2016 1 1143728

(51) Int. Cl.
*G05F 1/56*    (2006.01)
*H03K 17/56*   (2006.01)
(Continued)

(52) U.S. Cl.
CPC ......... *G05F 1/56* (2013.01); *H03K 17/04106* (2013.01); *H03K 17/04163* (2013.01);
(Continued)

(58) Field of Classification Search
CPC .......... G05F 1/461; G05F 1/462; G05F 1/563; G05F 1/565; G05F 1/56
See application file for complete search history.

(56) References Cited

U.S. PATENT DOCUMENTS

2005/0189930 A1*  9/2005  Wu ..................... G05F 1/575
                                                   323/280
2007/0241730 A1* 10/2007  Dow .................... G05F 1/575
                                                   323/280
(Continued)

OTHER PUBLICATIONS

Lai et al. (2013). A power-efficient on-chip linear regulator assisted by switched capacitors for fast transient regulation. In Quality Electronic Design (ISQED), 2013 14th International Symposium on (pp. 682-688). IEEE.
(Continued)

*Primary Examiner* — Jue Zhang
*Assistant Examiner* — Lakaisha Jackson
(74) *Attorney, Agent, or Firm* — Caesar Rivise, PC

(57) ABSTRACT

The present invention relates to a linear regulator with real-time frequency compensation function, which belongs to the technical field of analog integrated circuits. The part of frequency compensation of the present invention includes the dual-frequency compensation networks and compensation transfer switcher, and the pulse delay circuit. The dual-frequency compensation networks and compensation transfer switcher provide the corresponding frequency compensation for linear regulator under two different capacitive loads. The pulse delay circuit generates a set of signals which have a delay related to the switch-pulse signals to control the access of the compensation transfer switcher and capacitive load. The advantages of the present invention are that the circuit structure is simple, without complex feedback control circuits, the excessive power dissipation is extremely low, and it is applied to such special use of linear regulator with switched capacitive load that it can option the loop frequency compensation in real-time to ensure the linear regulator has the optimal stability and load transient response.

4 Claims, 4 Drawing Sheets

(51) Int. Cl.
*H03K 17/041* (2006.01)
*H03K 17/0416* (2006.01)
*G05F 1/46* (2006.01)
*G05F 1/563* (2006.01)

(52) U.S. Cl.
CPC ............ *H03K 17/56* (2013.01); *G05F 1/461* (2013.01); *G05F 1/462* (2013.01); *G05F 1/563* (2013.01)

(56) References Cited

U.S. PATENT DOCUMENTS

| | | | | |
|---|---|---|---|---|
| 2012/0038332 A1* | 2/2012 | Lin | ............ | G05F 1/575 323/277 |
| 2016/0077535 A1* | 3/2016 | Chen | ............ | G05F 1/575 323/280 |
| 2016/0173066 A1* | 6/2016 | Yang | ............ | H03K 19/0013 327/109 |
| 2016/0349776 A1* | 12/2016 | Conte | ............ | G05F 1/575 |
| 2017/0199535 A1* | 7/2017 | Takano | ............ | G05F 1/56 |

OTHER PUBLICATIONS

Parikh et al. (2016). New technique to improve transient response of LDO regulators without an off-chip capacitor. In VLSI Design and Test (VDAT), 2016 20th International Symposium on (pp. 1-5). IEEE.

* cited by examiner

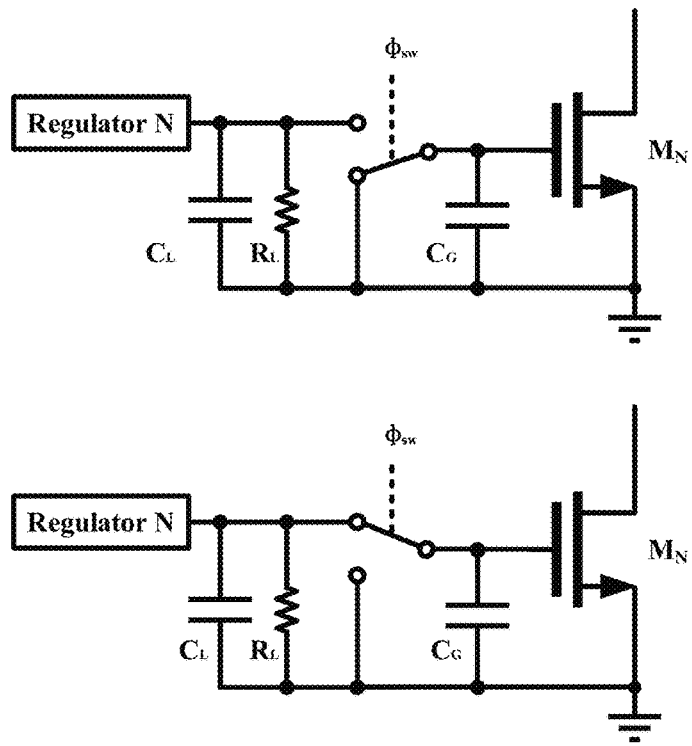
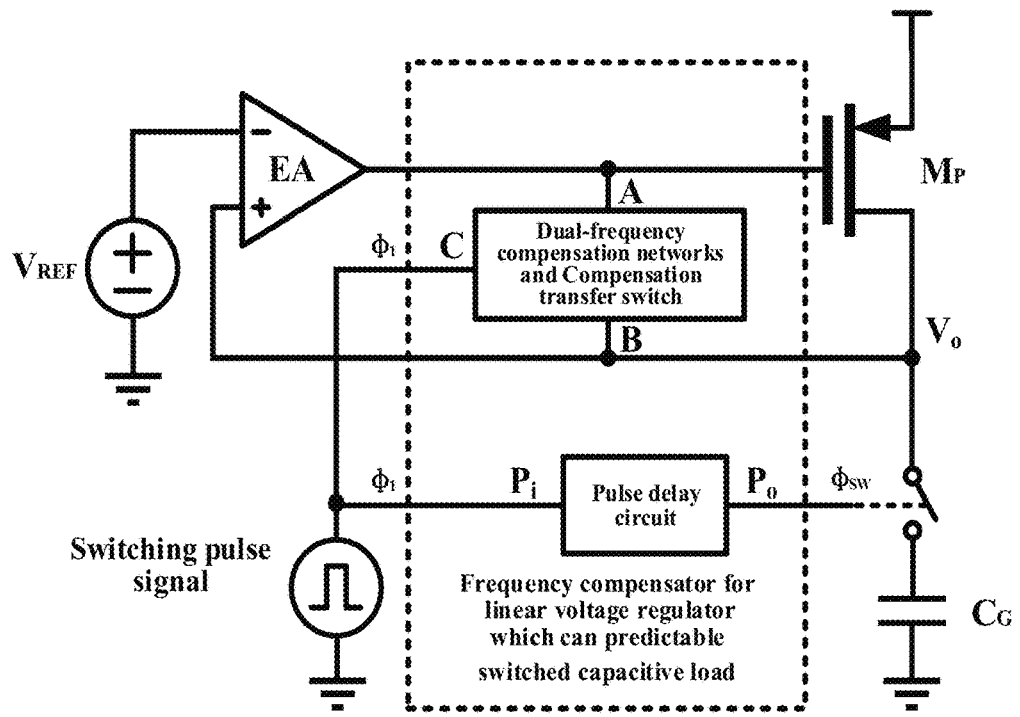
Figure 3
Figure 4

LINEAR REGULATOR WITH REAL-TIME FREQUENCY COMPENSATION FUNCTION

TECHNICAL FIELD

The present invention belongs to the technical field of analog integrated circuits, and in particular, to a linear regulator with real-time frequency compensation function.

BACKGROUND TECHNOLOGY

Linear regulator is a common circuit module in integrated circuits, its basic structure is shown in FIG. 1. For example, in order to provide a stable voltage to the power MOSFET in the high speed MOSFET driver, the linear regulator is necessary to produce driving voltage.

Taking the application of the linear regulator in half-bridge MOSFET driver as an example, as shown in FIG. 2, the MOSFET has gate capacitances $C_{gs}$, $C_{gd}$ with large capacitance. And they are equaled to a single gate capacitance $C_G$. For the MOSFET driver needs to control the on and off states of the MOSFET periodically, the MOSFET driver circuits need to charge and discharge the capacitance $C_G$ quickly. With switching the state of the MOSFET driver circuit, the load of the linear regulator will abruptly change as well. Taking the low N-MOSFET driver and the corresponding linear regulator N as an example, as shown in FIG. 3, when the MOSFET is off, the output of the linear regulator is disconnected from the MOSFET. At this time, the load capacitance of the linear regulator is small and the position of the output pole is high, and it is stable for the linear regulator with an internal dominant pole. When the MOSFET is on, the output of the linear regulator connects to the gate of the MOSFET. At this time, the main load of the MOSFET driver circuit is the gate capacitance $C_G$ and the output pole decreases significantly so as to reduce the phase margin of the linear regulator, to degrade the loop performance easily and even to cause the system self-oscillation. When the state of the MOSFET driver circuit switches, the $C_G$ connects and disconnects to the MOSFET driver circuit periodically. It influences the stability and the response speed of the linear regulator without the external capacitance. The main reason for this problem is that the linear regulator without capacitance is usually designed for resistance loads or certain capacitance loads. But the MOSFET working in off and on state and its driver circuit is a capacitances load which changes periodically. Its stability, response speed and optimum frequency compensation circuit need to be concerned separately according to the two states of the loads.

This kind of problem also occurs in the condition of applying the linear regulator which capacitance load may change abruptly, especially in the linear regulator without external capacitance.

CONTENT OF THE INVENTION

This invention aims to put forward a novel frequency compensation technology for the linear regulator which can predict switched capacitive load to provide the optimized frequency compensation synchronizing with the switched capacitive load.

The technical program of this invention is a linear regulator with real-time frequency compensation function. And the linear regulator comprises the error amplifier EA, the regulate transistor $M_P$, the capacitive load $C_G$ controlled by the switching pulse signals, the dual-frequency compensation networks and compensation transfer switcher, and the pulse delay circuit.

The non-inverting input of the error amplifier EA connects to the output of the linear regulator $V_o$, the inverting input thereof connects to the reference voltage $V_{REF}$, the output thereof connects to the gate of the regulate transistor $M_P$; The source of the regulate transistor $M_P$ connects to the power source, the drain of the regulate transistor $M_P$ connects to the output of the linear regulator $V_o$; The capacitive load $C_G$ controlled by the switching signals is connected between the ground and the drain of the regulate transistor $M_P$. One port of the dual-frequency compensation networks and compensation transfer switcher connects to the connection of output of the error amplifier EA and the gate of the regulate transistor $M_P$, another port connects to the output port of the linear regulator or to the signal ground, the control port of the dual-frequency compensation networks and compensation transfer switcher connects to the switching pulse signals $\varphi_1$ from the outside; The input port $P_i$ of the pulse delay circuit connects to the switching pulse signal $\varphi_1$, the output port $P_o$ thereof connects to the control switcher of the capacitive load $C_G$.

The dual-frequency compensation networks and compensation transfer switcher of the present invention consists of the first compensation network, the second compensation network, and the compensation transfer switcher. And the compensation transfer switcher is used for controlling and real-time switching the connection ways of the first compensation network and the second compensation network which include connecting the single of the two compensation networks, connecting in parallel and connecting in series of the two compensation networks at least.

The pulse delay circuit of the present invention is to produce a fixed-delay time to make the compensation networks switch earlier than connect to the switch of the capacitive load of the linear regulator.

The first compensation network and the second compensation network are used for providing the corresponding frequency compensation for the linear regulator under two different capacitive loads.

The first compensation network and the second compensation network usually comprise passive devices, such as resistors, capacitors and the like. The designer should select the value of corresponding components according to the frequency characteristic in need. The compensation transfer switcher usually consists of MOSFET switchers or CMOS transmission gates.

The pulse delay circuit of the present invention usually consists of conventional delay circuits such as RC delay circuit and inverter delay chain and the like.

The dual-frequency compensation networks of the present invention consist of the compensation network 1 and the compensation network 2 and the compensation transfer switcher. The connection ways between the compensation network 1, the compensation network 2 and the compensation transfer switcher have many equivalence structures. There are three different ways to connect to the compensation transfer switcher: connecting the single of the two compensation networks, connecting in parallel and connecting in series of the two compensation networks. In the way of connecting the single of them, the switcher only connects one of the two compensation networks, the other is open. In the way of connecting in parallel, the compensation transfer switcher always connects the compensation network 1. When the switch is off, the characteristic of the dual-frequency compensation network is same as the compensation network 1. When the switch is on, the characteristic of the dual-frequency compensation network is same as the compensation network1 and compensation network 2 connected in parallel. In the way of connecting in series, the compensation transfer switcher parallel connects to the two nodes of the compensation network 2. And then the parallel circuit connects in series to the compensation network1 to form a new compensation network. When the switcher is off, the characteristic of the dual-frequency compensation network is same as the compensation network 1 and the compensation network 2 connected in series. When the switcher is on, the characteristic thereof is same as the compensation network 1. And there are two connection modes of the compensation networks: single-ended connection and double-ended connection. In the mode of the double-ended connection, node A connects to the output of the error amplifier EA and node B connects to the output of the linear regulator. In the mode of the single-ended connection, node A connects to the output of the error amplifier EA and node B connects to the small signal ground. And the above-mentioned 3 different connection ways are separately exists in the two connection modes. Therefore, there are 6 types of circuits belong to the dual-frequency compensation networks and compensation transfer switcher of the present invention.

The frequency compensation technical scheme of the present invention is that the compensation network 1 and the compensation network 2 of the dual-frequency compensation networks provide the corresponding frequency compensation for the linear regulator under two different capacitive loads to ensure the linear regulator has the best reliability and optimum load transient response. The compensation transfer switcher is used for switching the internal signal paths of the linear regulator by connecting different compensation networks. The function of the pulse delay circuit is to produce a fixed-delay time to make the switcher of the compensation networks switch earlier than connect to the switch of the capacitive load of the linear regulator. When switching the pulse signal $\varphi_1$ from the outside, the delay circuit produces a pulse signal $\varphi_{sw}$ which lags behind $\varphi_1$ to control the capacitive load transfer switcher. And the pulse signal $\varphi_1$ controls the compensation transfer switcher. In this way, the pulse signal $\varphi_1$ of the compensation transfer switcher is earlier than the signal $\varphi_{sw}$ of the capacitive load transfer switcher. And the delay time should longer than the set time of the compensation transfer switcher to ensure that the corresponding frequency compensation for the load has been switched when the capacitive load of the linear regulator changed abruptly.

The advantages of the present invention are that the circuit structure is simple, without complex feedback control circuits, the excessive power dissipation is extremely low, and it is applied to such special use of linear regulator with switched capacitive load that it can option the loop frequency compensation in real-time to ensure the linear regulator has the optimal stability and load transient response. Compared with the traditional technology of frequency compensation, the capacitive load transient response of the linear regulator of the present invention improved remarkably.

DESCRIPTION OF FIGURES

FIG. 3 is the relationship diagram of the state of the MOSFET and the capacitive load of the linear regulator;

FIG. 4 is the applied principle diagram of the frequency compensation technology of the present invention;

DESCRIPTION OF THE PREFERRED EMBODIMENT

Figure 1:
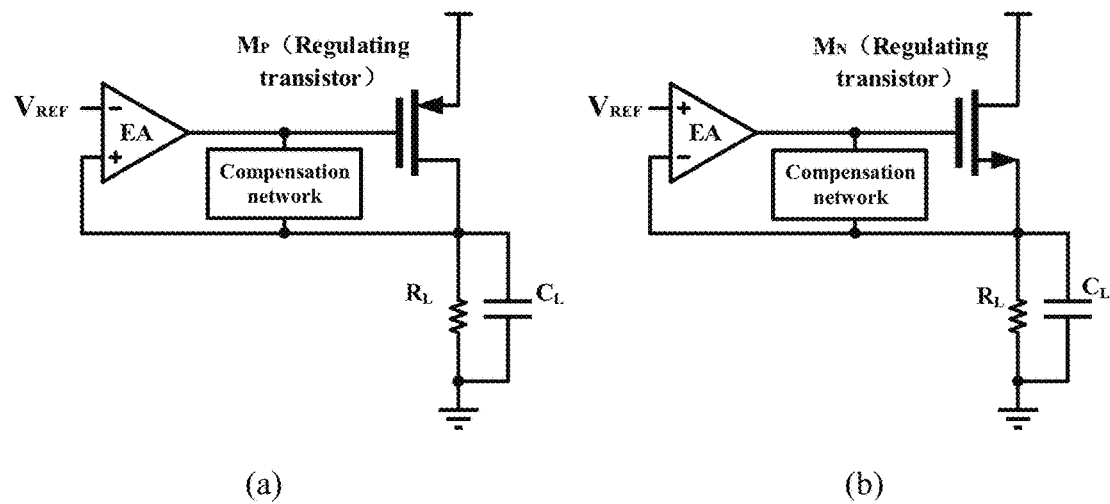
FIG. 1 is the structure diagram of traditional linear regulator, wherein (a) using P-type regulate transistor, (b) using N-type regulate transistor.
Figure 2:
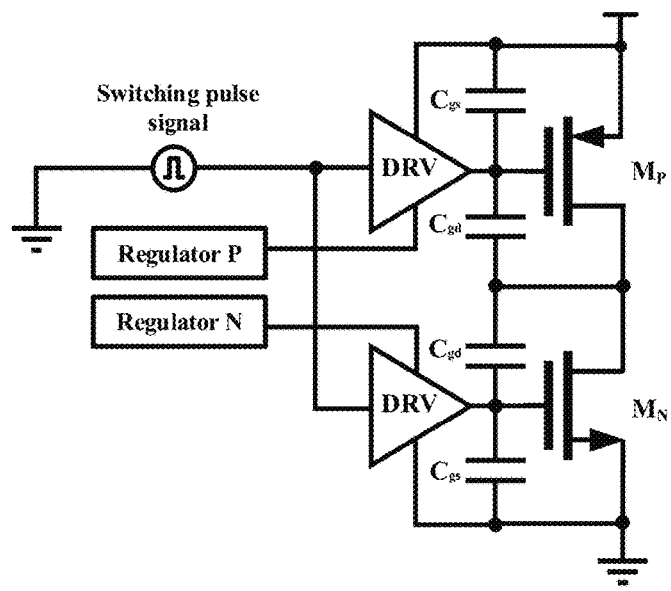
FIG. 2 illustrates the application of the linear regulator in half-bridge MOSFET driver circuit and the capacitive load thereof.
Figure 5:
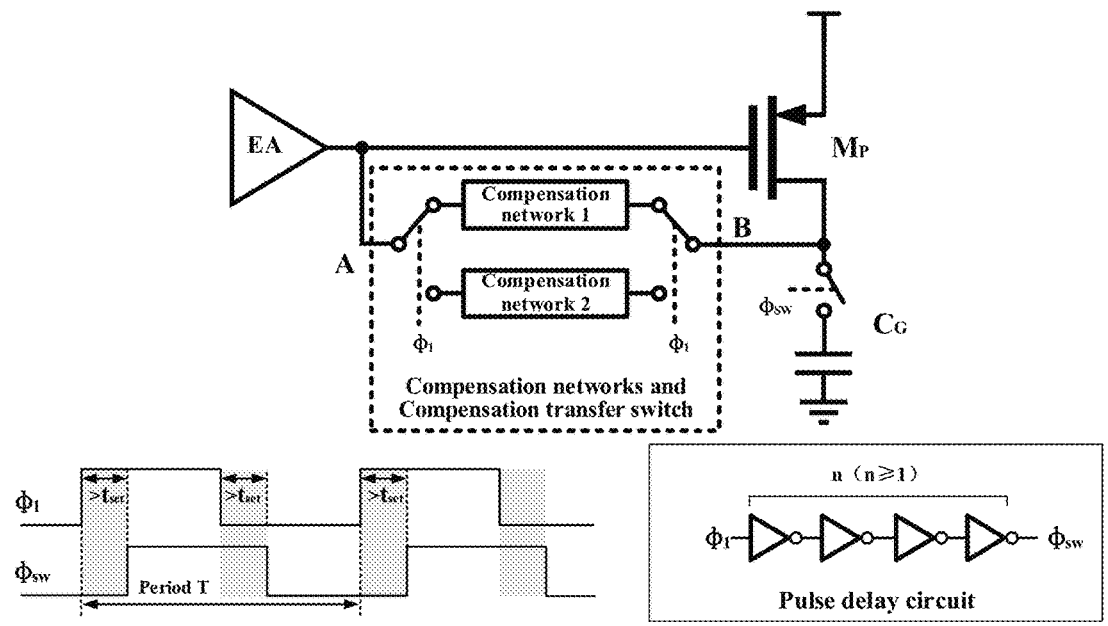
FIG. 5 is an implementation diagram of the frequency compensation technology of the present invention.
Figure 6:
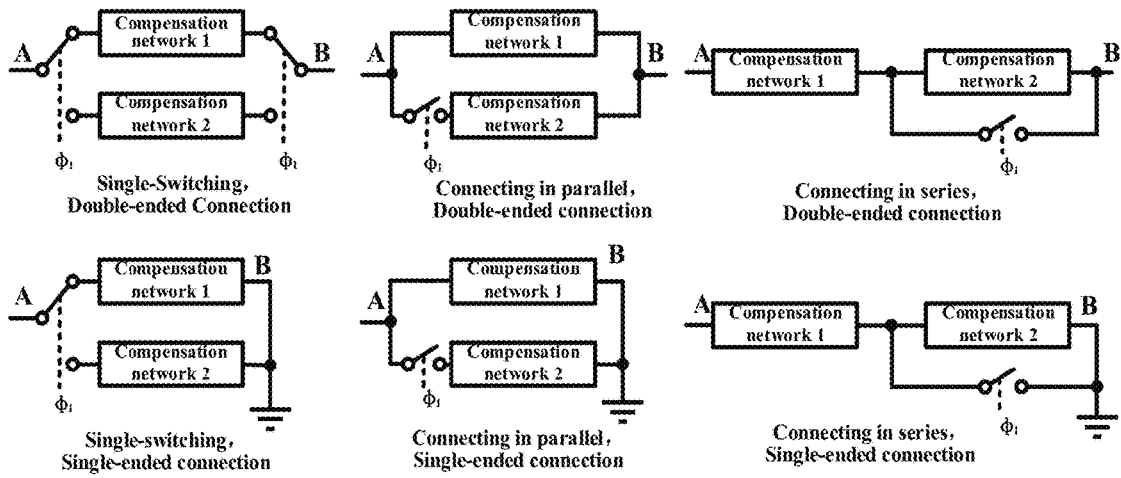
FIG. 6 shows other equivalence structures of the frequency compensation technology of the present invention.
Figure 7:
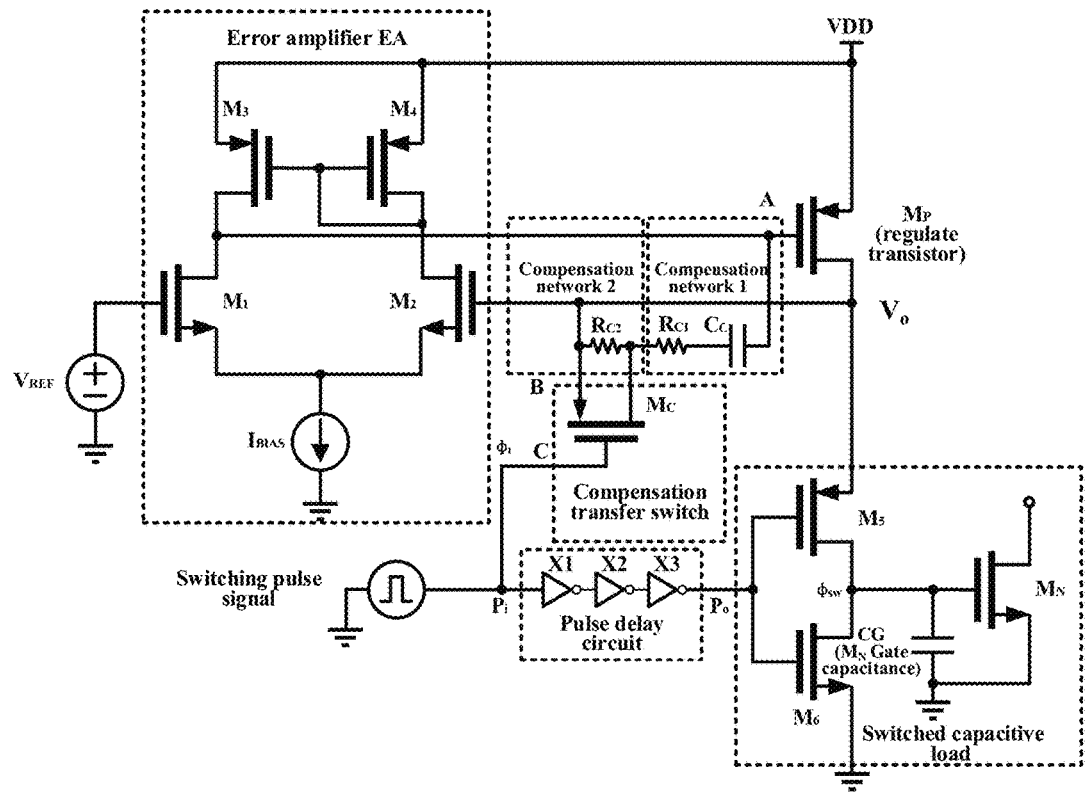
FIG. 7 is a practical application circuit diagram of the frequency compensation technology of the present invention.

Based on the drawings and the embodiment, the specific implementation methods of the invention are described as follows:

A circuit of the technology of the present invention is shown in FIG. 7. It is the application of the technology in the linear regulator of the MOSFET driver. The structure of the circuit comprises the PMOS transistors M3, M4, M5, $M_P$, $M_C$, and the NMOS transistors M1, M2, M6, and the inverters X1, X2, X3, the current source $I_{BIAS}$, the reference voltage source $V_{REF}$, the resistors $R_{C1}$, $R_{C2}$, and the capacitors $C_C$, $C_G$. The gate of M1 connects to the positive pole of $V_{REF}$, the source thereof connects to the negative pole of $I_{BIAS}$ and the drain thereof connects to the drain of M3. The negative pole of the reference voltage source connects to the ground. The positive pole of the current source $I_{BIAS}$ connects to the ground. The source of M2 connects to the negative pole of $I_{BIAS}$ and connects to the source of M1 at the same time, the gate thereof connects to the voltage-stabilized output node $V_o$, and the drain thereof connects to the drain of M4. The gate of M3 connects to the gate of M4, and connects to the drain of M3 and the drain of M1, and the source thereof connects to the power source VDD. The source of M4 connects to the power source VDD and the drain thereof connects to the drain of M2 and connects to the gate of $M_P$. The source of $M_P$ connects to the power source VDD and the drain thereof connects to the voltage-stabilized output node $V_o$. $R_{C1}$, $R_{C2}$ and $C_C$ are connected in series. $R_{C1}$ connects to the voltage-stabilized output node $V_o$. The node of $C_C$ connects to the gate of $M_P$, to the drain of M2 and M4. The source of $M_C$ connects to the voltage-stabilized output node $V_o$, the drain thereof connects to the connection between $R_{C1}$ and $R_{C2}$, and the gate thereof connects to the switching pulse signal $\varphi_1$. The inverters X1, X2, X3 connect in series, i.e. the output of X1 connects to the input of X2, the output of X2 connects to the input of X3, and the input of X1 connects to the switching pulse signal $\varphi_1$, the output of X3 connects to the gate of M5 and M6. M5 and M6 form the last inverter of the MOSFET driver. Their gates and drains are connected. The source of M5 connects to the voltage-stabilized output node $V_o$. The source of M6 connected to the ground. The gate capacitance of the power MOSFET is equal to $C_G$, which is connected between the ground and the drain of M5 and M6.

In the embodiment, M1, M2, M3, M4, $I_{BIAS}$ constitute the error amplifier; $R_{C1}$ constitutes the compensation network 1; $C_c$ constitutes the compensation network 2; $M_C$ is the compensation transfer switcher; X1, X2, X3 connection in series constitute the pulse delay circuit; $M_P$ is the regulate transistor of the linear regulator. $C_G$ is the equivalent gate capacitance of the MOSFET $M_N$; M5, M6 and $C_G$ constitute the switched capacitive load of the output of the linear regulator.

The operating principle of the embodiment is:

M1~M4 constitute a typical one stage error amplifier, wherein non-inverting input connects to the reference voltage source $V_{REF}$ and inverting input connects to the voltage-stabilized output node $V_o$, And constitutes the linear regulator with the regulate transistor $M_P$. It is possible to obtain the low-frequency gain of the regulator:

$$|A_V| \approx g_{m1} r_{o3} g_{mp} r_{op}$$

wherein $g_{m1}$ and $g_{mp}$ separately indicate the transconductance of M1 and $M_P$. And $r_{o1}$, $r_{op}$ indicate the small-signal output impedance of M1 and $M_P$. Considering the frequency characteristic of the regulator, there are two poles in the system before adding the compensation circuits and the AC small signal gain can be expressed as below:

$$A_V(s) = \frac{|A_V|}{\left(\frac{s}{p_1}+1\right)\left(\frac{s}{p_2}+1\right)} \approx \frac{g_{m1} r_{o3} g_{mp} r_{op}}{\left(\frac{s}{p_1}+1\right)\left(\frac{s}{p_2}+1\right)}$$

Wherein, the pole 1 locates in the output node of the error amplifier, and the pole 2 locates in the output node $V_o$ of the linear regulator. After the pole 1 introducing the miller compensation, the pole 1 becomes the main pole and it introduces a zero at the same time:

$$\omega_z \approx \frac{1}{C_c\left(\frac{1}{g_{mp}} - R_c\right)}$$

The position of the zero is usually located in between the position of pole 1 and pole 2. Therefore, the system is stable before adding the capacitive load $C_G$. When $C_G$ is added, the position of pole 2 has changed. The capacitance of the node of $C_G$ has increased more than 100 times. The position of the pole may near the pole 1 and zero, even between the position of pole 1 and zero, which results to the decrease of phase margin.

The formula of the position of pole 2 can be expressed as follow:

$$\omega_{p2} \approx \frac{1}{C_G r_o}$$

After introducing the compensation transfer switcher $M_C$, when it turns off, it increases the value of zero compensation resistance $R_C$ without introducing $C_G$. According to the formula, the increasing of $R_C$ can lower the position of the zero frequency. Therefore, the position of zero frequency will decrease with $M_C$ turning off and increase with $M_C$ turning on. By use of the signal $\varphi_1$ to control $M_C$ can make the position of compensation zero move simultaneously with pole $p_2$.

As the value of the gate capacitance $C_G$ of MOSFET is known, if the value of $R_{C1}$ and $R_{C2}$ can be designed accurately according to the changing of pole 2 which is introduced by $C_G$, it can be ensured that the system will always have enough phase margin whether the $C_G$ has been introduced to the load of the regulator or not when the compensation zero is lower than or near the position of pole 2.

Figure 8:
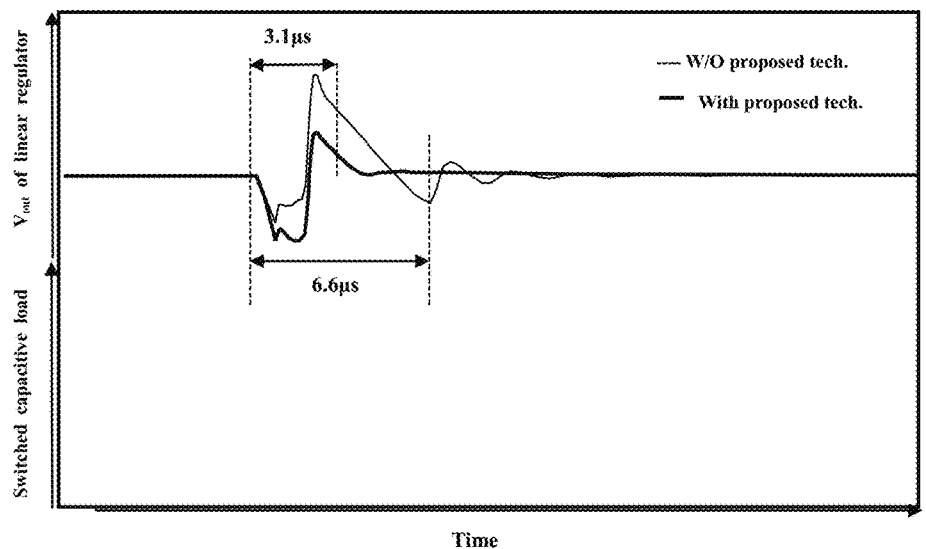
FIG. 8 is the diagram of improvement of the capacitive load transient response of the linear regulator with the technology of the present invention.

By use of the technology of the present invention, the capacitive load transient response of the circuit of the embodiment is improved to some extent. By comparing with the software simulation, the ware-form of the transient response is shown in FIG. 8. The time of transient response is a little longer without using the technology of the present application and it is about 6.6 μs, while with applying the technology, the transient response is faster and its setup time is about 3.1 μs. It can be seen that by use of the frequency compensation technology, the performance of the capacitive load transient response of the linear regulator can be improved more than 50% by comparing with the traditional frequency compensation technology.

What is claimed is:

1. A linear regulator with real-time frequency compensation function, the linear regulator comprising:
   an error amplifier EA,
   a regulate transistor $M_P$,
   a capacitive load $C_G$ controlled by switching pulse signals $\varphi_1$,
   dual-frequency compensation networks,
   a compensation transfer switcher, and
   a pulse delay circuit,
   the non-inverting input of the error amplifier EA connects to the output of the linear regulator $V_o$, and the inverting input of the error amplifier EA connects to a reference voltage $V_{REF}$, the output of the error amplifier EA connects to the gate of the regulate transistor $M_P$,
   the source of the regulate transistor $M_P$ connects to a power source, and the drain of the regulate transistor $M_P$ connects to the output of the linear regulator $V_o$,
   the capacitive load $C_G$ controlled by the switching pulse signals is connected between the ground and the drain of the regulate transistor $M_P$,
   one port of the dual-frequency compensation networks and compensation transfer switcher connects to the output of the error amplifier EA and the gate of the regulate transistor $M_P$, and another port of the dual-frequency compensation networks connects to the output of the linear regulator or connects to ground, a control port of the dual-frequency compensation networks and compensation transfer switcher connects to the switching pulse signals $\varphi_1$,
   an input port $P_i$ of the pulse delay circuit connects to the switching pulse signals $\varphi_1$, and an output port $P_o$ of the pulse delay circuit connects to a control switcher of the capacitive load $C_G$.

2. The linear regulator according to claim 1, wherein the dual-frequency compensation networks and compensation transfer switcher includes a first compensation network, a second compensation network, and a compensation transfer switcher, wherein the compensation transfer switcher is used for controlling and real-time switching the connection ways of the first compensation network and the second compensation network which includes at least one of connecting one of the two compensation networks, connecting both of the two compensation networks in parallel, and connecting both of the two compensation networks in series.

3. The linear regulator according to claim 2 wherein the first compensation network and the second compensation network are used for providing the corresponding frequency compensation for the linear regulator under two different capacitive loads.

4. The linear regulator according to claim 1 wherein the pulse delay circuit provides a fixed-delay time to make the dual-frequency compensation networks switch earlier than connecting to a switch of the capacitive load of the linear regulator.

* * * * *